US011128073B2

(12) United States Patent
Hieber et al.

(10) Patent No.: US 11,128,073 B2
(45) Date of Patent: Sep. 21, 2021

(54) PLUG CONNECTOR

(71) Applicant: PHOENIX CONTACT GmbH & Co. KG, Blomberg (DE)

(72) Inventors: Alexander Hieber, Herrenberg (DE); Michael Delker, Herrenberg (DE)

(73) Assignee: PHOENIX CONTACT GmbH & Co. KG, Blomberg (DE)

( * ) Notice: Subject to any disclaimer, the term of this patent is extended or adjusted under 35 U.S.C. 154(b) by 0 days.

(21) Appl. No.: 16/765,337

(22) PCT Filed: Oct. 12, 2018

(86) PCT No.: PCT/DE2018/100839
§ 371 (c)(1),
(2) Date: May 19, 2020

(87) PCT Pub. No.: WO2019/101262
PCT Pub. Date: May 31, 2019

(65) Prior Publication Data
US 2020/0358216 A1 Nov. 12, 2020

(30) Foreign Application Priority Data
Nov. 21, 2017 (DE) ...................... 10 2017 127 482.0

(51) Int. Cl.
*H01R 12/57* (2011.01)
*H01R 12/72* (2011.01)
(Continued)

(52) U.S. Cl.
CPC .......... *H01R 12/724* (2013.01); *H01R 12/57* (2013.01); *H01R 12/58* (2013.01); *H01R 13/04* (2013.01);
(Continued)

(58) Field of Classification Search
CPC ...... H01R 12/724; H01R 12/57; H01R 12/58; H01R 13/04; H01R 13/42; H01R 13/4361; H05K 3/303; H05K 2201/10189
See application file for complete search history.

(56) References Cited

U.S. PATENT DOCUMENTS 3,818,278 A * 6/1974 Adler ................. H01R 33/7635
361/767
4,080,041 A * 3/1978 Hawkins, Jr. ........ H01R 13/436
439/629
(Continued)

FOREIGN PATENT DOCUMENTS

DE  19618497 A1  11/1997
DE  69309761 T2  11/1997
(Continued)

OTHER PUBLICATIONS

International Search Report for corresponding Application No. PCT/DE2018/100839, dated Mar. 14, 2019.

*Primary Examiner* — Truc T Nguyen
(74) *Attorney, Agent, or Firm* — Renner, Otto, Boisselle & Sklar, LLP

(57) ABSTRACT

A plug connector for establishing an external connection to a printed circuit board, including at least two angled pin-shaped contacts including a first leg, for making contact with a mating plug connector, and a second leg, for making contact with the printed circuit board, an insulating body for accommodating the contacts at least in the region of the first leg, and a contact carrier for accommodating the contacts at the second leg thereof, wherein the contacts, at the end of the second leg, include a stop acting in the axial direction, and the contact carrier includes through-openings including a counter-stop for the second legs and can be moved in the axial direction of the second legs into a housing and be fixed therein. In this way, all the contacts are located on one plane (Continued)

with respect to the printed circuit board and allow the use of SMD or THR processes.

12 Claims, 6 Drawing Sheets

(51) Int. Cl.
    *H01R 12/58* (2011.01)
    *H01R 13/04* (2006.01)
    *H01R 13/42* (2006.01)
    *H05K 3/30* (2006.01)
(52) U.S. Cl.
    CPC ............. *H01R 13/42* (2013.01); *H05K 3/303* (2013.01); *H05K 2201/10189* (2013.01)

(56) References Cited

U.S. PATENT DOCUMENTS

| | | | | |
|---|---|---|---|---|
| 4,286,837 A | * | 9/1981 | Yasutake | H01R 43/00 439/637 |
| 4,944,688 A | * | 7/1990 | Lundergan | H01R 13/443 439/275 |
| 5,167,531 A | | 12/1992 | Broschard | |
| 5,453,016 A | * | 9/1995 | Clark | H01R 12/724 439/79 |
| 5,957,705 A | * | 9/1999 | David | H01R 12/716 439/79 |
| 6,494,724 B1 | * | 12/2002 | Bixler | H01R 13/506 439/79 |
| 7,537,465 B2 | * | 5/2009 | Fang | H01R 12/716 439/247 |
| 10,916,868 B2 | * | 2/2021 | Bogursky | H01R 43/16 |
| 2004/0157500 A1 | * | 8/2004 | Krantz, Jr. | H01R 12/58 439/744 |
| 2005/0059275 A1 | * | 3/2005 | Swantner | H01R 24/50 439/79 |
| 2006/0216972 A1 | * | 9/2006 | Modinger | H01R 43/0256 439/83 |
| 2011/0143564 A1 | | 6/2011 | Lee | |
| 2014/0118973 A1 | * | 5/2014 | Nastasa | H05K 3/3447 361/760 |
| 2016/0164233 A1 | * | 6/2016 | Zhu | H01R 24/50 439/248 |

FOREIGN PATENT DOCUMENTS

DE        197 54 877 A1     7/1999
JP         2003257518 A     9/2003

* cited by examiner

PLUG CONNECTOR

TECHNICAL FIELD OF THE INVENTION

The invention relates to a plug connector for establishing an external connection to a printed circuit board, comprising at least two angled pin-shaped contacts including a first leg for making contact with a mating plug connector and a second leg for making contact with the printed circuit board, an insulating body for accommodating the contacts at least in the region of the first leg, and a contact carrier for accommodating the contacts at the second leg thereof.

BACKGROUND OF THE INVENTION

In the case of plug connectors thus designed, essentially two variants are widely used when it comes to the plug connectors available in the market. In the first variant, the angled contacts are fixed in an insulating body by way of form fitting or press fitting. Another component radially guides the legs of the angled contacts, which are oriented toward the surface of the printed circuit board. This allows tolerances in the manufacturing process to be compensated for, and the radial guidance offers additional protection against twisting of the contacts when these are mounted on a printed circuit board, which is typically carried out by hand. The second variant does not require the additional component for guidance and, instead, relies on improved form fitting between the insulating body and the contacts, so as to effectively increase the resistance against a twisting the contacts, in particular during mounting.

However, both variants only take the radial positioning of the contacts relative to the surface of a printed circuit board into consideration, but not the growing requirements with regard to the axial positioning of the contacts relative to the surface of a printed circuit board which result from new processes for attaching the plug connectors to the printed circuit board. When attaching the plug connectors by way of a combination of wave soldering and through-hole reflow (THR) processes or in the form of a surface-mount device (SMD), several tolerances come into play, such as the manufacturing tolerance of the contact, of the insulating body, and possibly of other components. In addition to the radial guidance of the contacts, the axial accuracy is thus also of importance.

DE 197 54 877 A1 describes a component that is designed to be mounted on a printed circuit board surface and includes a plurality of leads. The component is characterized in that the leads are at least partially fixed in a predetermined relative position by an adjustment element through which these extend. As a result, it can be achieved that the component can always be properly mounted on the printed circuit board surface. The plate-shaped adjustment element is pushed on from the free end sections of the leads over the latter, wherein the recesses of the adjustment element through which the leads extend, and the leads themselves, are designed so as to be clamped against one another in an intended final position of the adjustment element. The predetermined relative position into which the leads are to be brought by the adjustment element consists, among other things, in one in which the sections of the leads to be soldered to the printed circuit board are seated in one plane. The adjustment element is preferably placed last onto the component, which is otherwise finished. The leads are designed so that the adjustment element can initially be pushed on essentially without resistance, but continued pushing is accompanied by increasing mutual clamping. When the intended final position of the adjustment element is reached, the adjustment element and the leads are fixedly connected to one another so that a relative movement is no longer possible, and the leads are fixed in the relative positions thereof. The orientation of the leads described therein is not suitable for radial guidance due to the required design of the plug connector described at the outset.

It is therefore the object of the present invention to provide an option for the plug connector mentioned at the outset, for also aligning the contacts axially, while guiding the same radially, and for improving the axial accuracy. Furthermore, it should also be possible to produce a stable plug connector even prior to soldering.

SUMMARY OF THE INVENTION

According to the invention, this object is achieved by the features of claim 1. Further advantageous embodiments can be found in the respective subclaims dependent thereon.

According to the invention, the contacts, in a region at the end of the second leg, include a stop acting in the axial direction of the contacts. The stop is thus disposed as close to the end of the contact as possible, so as to stabilize and fix the contacts for the further mounting process. For this purpose, the contact carrier is disposed in the region of the second leg and includes through-openings, for the contacts, including a counter-stop. The contact carrier can be moved in the axial direction of the contacts into a housing accommodating the contact carrier and can be fixed thereon. The stop of the contact and the counter-stop in the contact carrier can be implemented in a variety of ways. This can be carried out, for example, by an annular collar, serving as a projection, or also by a steady (continuous) diameter taper having a change in diameter, which is to say a smaller diameter at the end of the contact, and a corresponding through-borehole having a taper, which is to say having a larger diameter and, adjoining the same, a smaller diameter separated by a projection, or by an elevation, which is provided at the circumference of the contact pin and annularly increases the outside diameter and a corresponding through-opening, likewise having differing diameters and a non-steady transition from the larger diameter to the smaller diameter, which limits the insertion of the contact in the axial movement direction. The increase in diameter can also be implemented by at least one punctiform elevation provided at the circumference. The contact carrier including the counter-stop is designed so that the end of the contact still protrudes from the contact carrier, so as to be able to connect this end to the printed circuit board. Depending on the design of the plug connector, the housing accommodating the contact carrier can be implemented by an integral molding at the insulating body, forming the housing, or as a separate housing part, wherein the contact carrier is moved in the radial direction over the free ends of the contacts into the housing and can be fixed therein in the axial direction of the contacts, but also in the radial direction of the contacts. When the housing is designed as an integral molding so that the insulating body also forms the housing for the contact carrier, shielding and stability of the plug connector on the printed circuit board prior to soldering are more complex to implement than in the case of design as a separate component.

As a result of this configuration, the contacts rest in a defined manner against the contact carrier. The annular collar at the contact serving as a stop, and the projection at the contact carrier serving as a counter-stop, are used to push the contact into the housing by way of a certain force. In this way, the angled contacts may possibly be bent upward, on a scale that covers the entire manufacturing tolerance of the individual contacts in the longitudinal tolerance thereof. The accompanying imprecise manufacturing tolerance of usually +/−0.1 mm is reduced to the accuracy of the bearing surface of the contact carrier.

According to a preferred embodiment of the invention, the stop, at least at the second leg, and the counter-stop in the through-openings are formed by a projection in the form of an annular collar at the transition from a larger diameter to a smaller diameter on the contacts, and the through-openings, the projections in the through-openings being located in one plane. The counter-stop thus does not have to be designed as a projection (discontinuous), but can also be designed as a steady diameter taper. It is thus possible to dispose all contacts on one plane with a tolerance of <0.1 mm, so that SMD techniques can also be used with this plug connector. In addition, the testing complexity can be reduced since it is no longer necessary to check the position of every contact.

For better insertion of the contacts into the through-openings, according to a preferred design, these are conically designed on the side of the contact carrier facing the first leg.

As described above, the housing can also be implemented by an appropriate configuration of an integral molding formed at the insulating body, which usually has an oblong design, for accommodating the first legs. According to a further embodiment, the housing extends at least partially over the insulating body, including the contacts disposed therein, in a rear insulating body part, and extends completely over the contact carrier. In this preferred embodiment, the housing partially extends over the insulating body, which usually has an oblong design, including a front insulating body part for the first legs of the contacts and for making contact with a mating plug connector, at the end of the insulating body facing the second legs (the rear insulating body part), so that the housing completely covers the end of the first legs and the second legs, together with the contact carrier. The housing can thus also be designed to be metallic, so as to implement the center of gravity of the plug connector in this region due to the weight, so that the plug connector can be placed on the printed circuit board in a self-supporting manner for the soldering process. Additionally, this provides the option of configuring the housing as a shield housing when designed as a metallic housing.

The contact carrier is preferably fixed in the housing by way of latching engagement. The contact carrier and the housing are accordingly matched to one another for this purpose, for example by suitable protrusions or openings in the housing and associated detent hooks at the contact carrier, or vice versa. The insulating body advantageously comprises at least one alignment appendage for insertion into a borehole on the printed circuit board, and alignment means for horizontally aligning the housing, so that the plug connector can thereby be placed precisely in the position thereof on the printed circuit board. The housing itself can be designed to be solderable so as to establish an additional connection between the plug connector and the printed circuit board.

The housing is advantageously U-shaped, comprising a cover connecting two side walls, so that the housing can be easily disposed on the printed circuit board, together with the insulating body, so as to extend partially over the contact carrier and completely over the insulating body.

So as to impart a shielding function to the housing, the housing should be designed to be metallic and cover all sides to as great an extent as possible. The housing is advantageously U-shaped, for this purpose, comprising a cover connecting two side walls, and still more preferably is designed as a shield plate comprising a rear wall and an opposing end wall, wherein the end wall extends over the front insulating body part of the insulating body and around the sides. Depending on the production, the end wall can be fixedly connected to the housing or be implemented by parts of the end wall that can be attached to the insulating body and are in electrical contact with the housing. The latter can, in particular, be necessary when the end wall comprises contact springs or is formed thereby, against which the mating plug connector strikes for fixation to the plug connector and to ensure sufficient contact is made by the shield and the mating plug connector with the housing.

The housing can preferably be metallic and designed, in terms of weight, so that the center of gravity ensures stable positioning of the entire plug connector prior to soldering. If the housing weighs enough, the housing can thus be used to ensure that the plug connector sits straight on the printed circuit board, in addition to ensuring adherence to the manufacturing tolerance during the soldering process, and in particular the SMD soldering process. The housing holds the plug connector level, so that the contacts with the first legs are situated horizontally in one plane. The center of gravity is shifted such that tilting of the plug connector during the soldering process is avoided. The housing is furthermore designed to be solderable as a metallic shield housing, so as to establish an additional connection between the connector and the printed circuit board, and so as to ensure shielded transmission and increased strength. In principle, the plug connector can also be attached to the printed circuit board by way of other soldering processes, such as THR processes.

In summary, it must be noted that the above-described plug connector can be used, on one hand, to achieve a manufacturing tolerance of <0.1 mm in the axial direction, wherein the contacts, with the ends thereof facing the printed circuit board, are located on one plane, to as great an extent as possible, and, moreover, shielding is achieved, with optimal stability of the plug connector.

The features and feature combinations mentioned above in the description, and the features and feature combinations mentioned hereafter in the description of the figures and/or shown only in the figures, can be used not only in the respective indicated combinations, but also in other combinations, or alone. It is not necessary for all the features of claim 1 to be implemented to carry out the invention. It is also possible to replace individual features of the independent or dependent claims with other disclosed features or feature combinations.

BRIEF DESCRIPTION OF THE DRAWINGS

All of the features and/or advantages that are apparent from the claims, the description or the drawings, including design details, arrangement in terms of space, and method steps, can be essential to the invention, both alone and in a wide variety of combinations. Identical or similar components are denoted by identical or similar reference numerals in the figures. In the drawings:

DETAILED DESCRIPTION OF THE INVENTION

Figure 1:
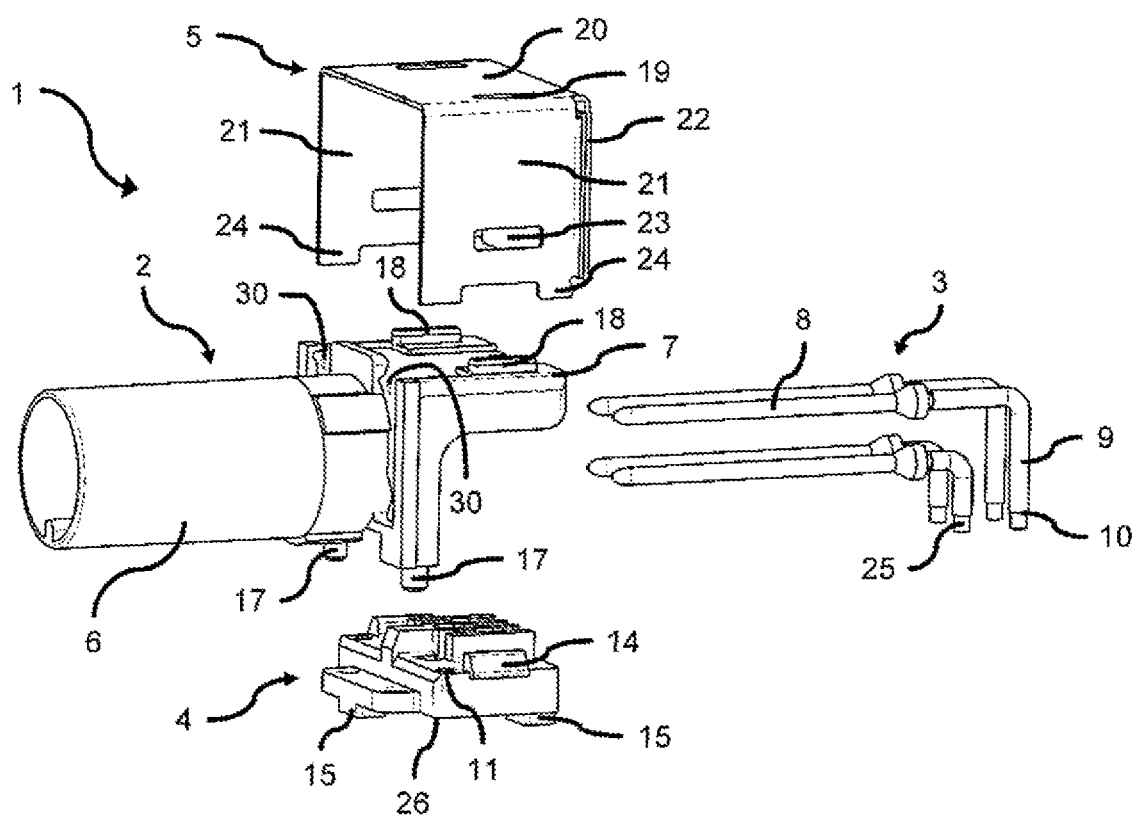
FIG. 1 shows the individual components of a plug connector according to the invention prior to assembly in a perspective exploded view.
Figure 5:
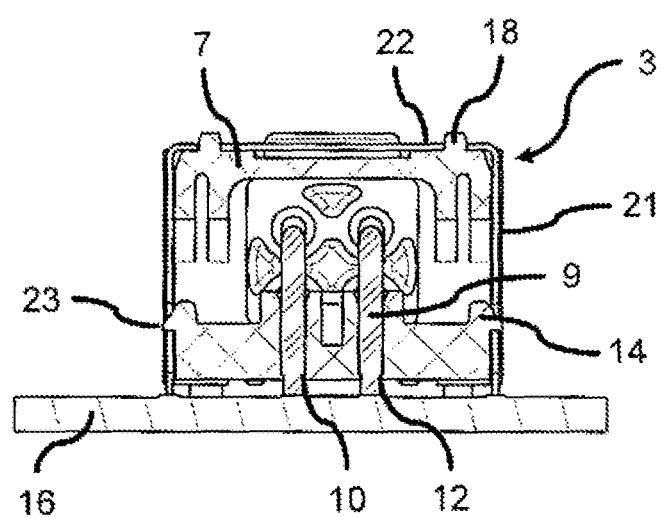
FIG. 5 shows a cross-sectional view through the plug connector corresponding to FIGS. 2 and 3 on a printed circuit board.
Figure 6:
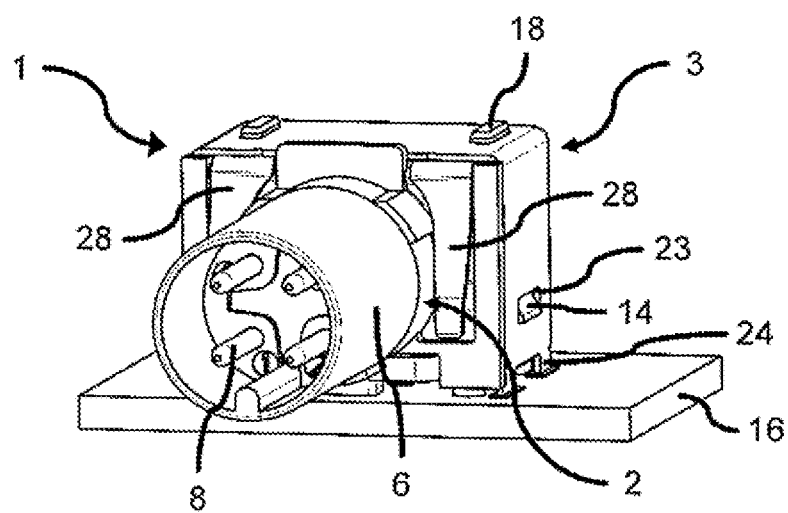
FIG. 6 shows a perspective view of the plug connector on a printed circuit board.

FIG. 1 shows the plug connector 1 comprising an insulating body 2, contacts 3, a contact carrier 4 and a housing 5, prior to assembly. The insulating body 2 comprises a front insulating body part 6 and a rear insulating body part 7, wherein the front tubular insulating body part 6 accommodates the first legs 8 of the right-angled contacts 3 in a manner insulated with respect to one another in the axial direction. The pin-shaped contacts 3 angled by 90° include the first leg 8, which is disposed in a horizontal direction in the installed state, and the second leg 9, which is disposed perpendicularly thereto and by way of which the contact with a printed circuit board 16 is established (FIGS. 5, 6). The second leg, at the free end thereof, comprises an annular collar 10 serving as a stop, so that the diameter of the second leg 9, at the free end after the annular collar 10, is smaller than in the remaining region of the second leg 9. The rear insulating body part 7 is used to fix the plug connector 1 on the printed circuit board 16, comprising, on the one hand, a locking pin 17 for insertion into corresponding openings in the printed circuit board 16 and, on the other hand, alignment means 18, in the form of elevations, which engage in corresponding openings 19 in the cover 20 of the housing 5 to stabilize the insulating body 2 and the housing 5. In principle, the housing 5 designed simply as a U-shaped housing comprising two side walls 21. In the exemplary embodiment, the housing serves as a shield and is thus designed to be metallic, and is additionally provided with a metallic rear wall 22. Due to the metallic design, in terms of weight, the housing 5 can be configured so as to ensure stable positioning of the entire plug connector 1 on the printed circuit board 16 for mounting, since otherwise the front insulating body part 6 would cause the plug connector 1 to tilt. Moreover, the housing 5 includes detent openings 23 at the side walls 21 for the engagement of the catch lugs 14 of the contact carrier 4. Feet 24 are also integrally formed onto the side walls, by way of which a soldered joint can be created on the printed circuit board 16 (FIG. 6).

The housing 5 shown in FIG. 1 does not include a front side, since this is formed, in this exemplary embodiment, by contact springs 28 (FIG. 6) that can be clamped to the rear insulating body part 7 from above at the site denoted by reference numeral 30, in conjunction with a metal sheet insert 29 (FIG. 4) that can be inserted on the upper side of the rear insulating body part 7. The contact springs 28 are thus electrically connected to the housing 5 by way of the metal sheet insert 29, so that a metallic shield housing is created, wherein the contact springs form an end wall located opposite the rear wall 22. By way of the contact springs 28, contact can then be made with the metallic connector housing of a mating plug connector, which is not shown, and which is pushed over the front insulating body part 6 to the housing 5 and the contact springs 28, so that connection is ensured to a braided shield of a cable that can be connected by way of the mating plug connector.

Figure 2:
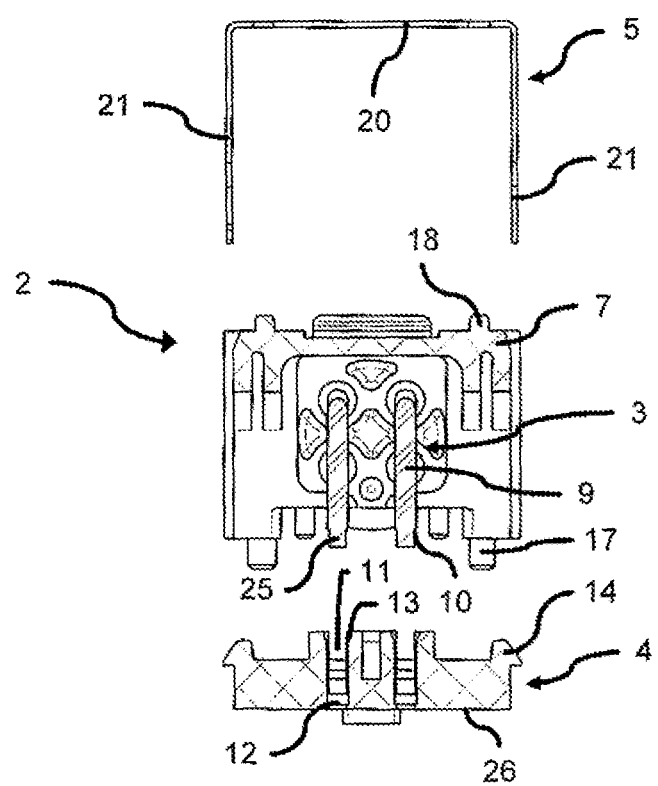
FIG. 2 shows a representation corresponding to FIG. 1 from the rear side, with a partial cross-sectional view through the plug connector and plugged-in contacts.
Figure 3:
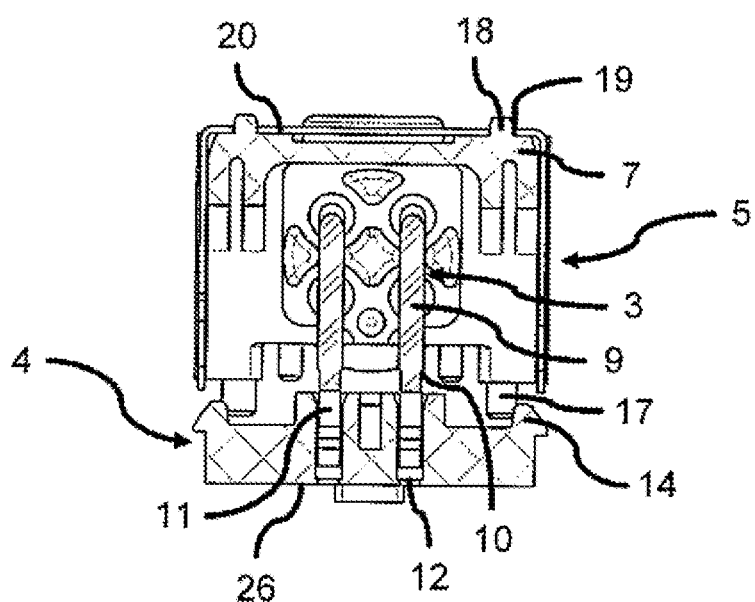
FIG. 3 shows a view similar to FIG. 2, including an attached housing and an aligned, but not inserted contact carrier.

In FIG. 2, the through-openings 11 are apparent in the sectional illustration of the contact carrier 4 and, for improved insertion, are conical in the insertion region for the second leg 9. In the vicinity of the bottom side 26 of the contact carrier 4 facing the printed circuit board 16, the through-openings 11 have a taper in the form of a projection 12 forming a stop, which, during mounting, limits the axial movement of the contact carrier 4 into the housing 5 by means of the stop at the annular collar 10 at the second leg 9 of the contacts. The movement of the contact carrier 4 during mounting is shown in FIG. 3, in which the housing 5 is already plugged onto the insulating body 2, and the contacts 3, with the second leg 9 thereof, are located in front of the through-opening 11 in the contact carrier 4.

Figure 4:
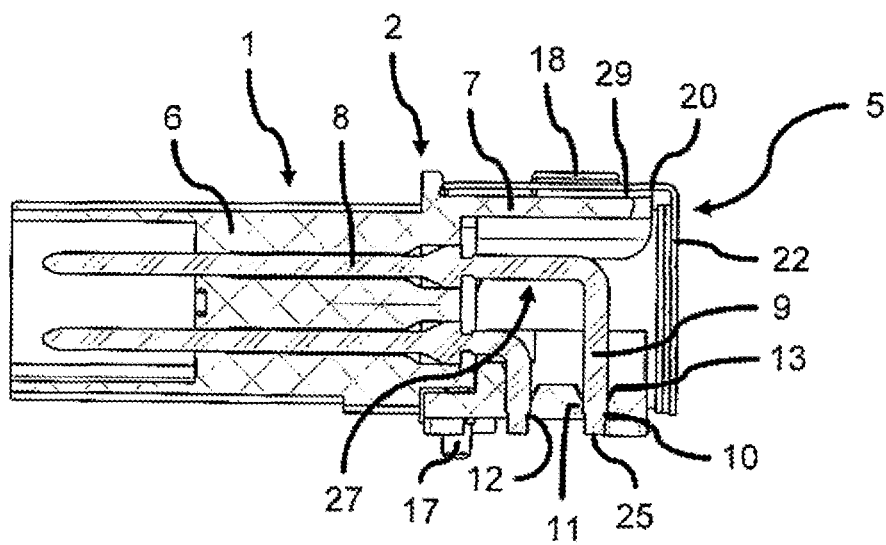
FIG. 4 shows a longitudinal sectional view through the plug connector in the fully mounted state.

In FIGS. 4 and 5, the contact carrier 4 is fixedly anchored in the housing 5 by way of the catch lugs 14 in the detent openings 23, and the ends 25 of the second legs 9 facing the printed circuit board protrude from the contact carrier 4, for the contact with terminals disposed accordingly in the printed circuit board 16, with a defined length having a low tolerance. FIGS. 4 and 5 show the finished plug connector 1 in a sectional view, including contacts 3 disposed in the insulating body 2 and the arrangement of the metallic housing 5 acting as a shield, and the contact carrier 4 fixed therein. As a result of the movement of the contact carrier 4 in the axial direction of the second legs 9 of the contacts 3, manufacturing tolerances of the individual contacts can be compensated for by an upward bending of the first legs 8, which extend essentially horizontally, in the region 27 of the housing 5. The stops 12 in the contact carrier 4 made of an insulating material, for example plastic, are located in one plane, so as to ensure that all contacts, with the free ends thereof, are located with the given manufacturing tolerance on one plane on the printed circuit board 16. As a result of the feet 15, the contact carrier 4 ideally rests on the printed circuit board 16, together with the feet 24 of the housing 5, wherein manufacturing tolerances in the axial direction of the second legs, due to the configuration of the catch lugs 14 and the engagement thereof in detent openings 23 in the housing 5, allow the contact carrier 4 to move upwardly relative to the housing 5, if necessary.

The invention claimed is:

1. A plug connector for establishing an external connection to a printed circuit board, comprising at least two angled pin-shaped contacts including a first leg, for making contact with a mating plug connector, and a second leg, for making contact with the printed circuit board, an insulating body for accommodating the contacts at least in a region of the first leg, and a contact carrier for accommodating the contacts at the second leg thereof, wherein the contacts, proximate an axial end of the second leg that is configured to make contact with the printed circuit board, include a stop acting in an axial direction of the second leg, and the contact carrier is disposed in the region of the second leg and includes through-openings including a counter-stop for the second legs, and can be moved in the axial direction of the second leg into a housing accommodating the contact carrier and fixed therein, wherein the stop, at least at the second leg, and the counter-stop in the through-openings are formed by an annular collar or a projection at a transition from a larger diameter to a smaller diameter on the second leg and the through-openings, at least the projection in the through-openings being located in one plane.

2. The plug connector according to claim 1, wherein the through-openings on the side of the contact carrier facing the first leg are conical.

3. The plug connector according to claim 1, wherein the housing extends at least partially over the insulating body, including the contact disposed therein, in a rear insulating body part, and extends over the contact carrier.

4. The plug connector according to claim 1, wherein the contact carrier can be latchingly engaged in the housing.

5. The plug connector according to claim 1, wherein the insulating body comprises at least one alignment appendage for insertion into a borehole on the printed circuit board, and alignment means for horizontally aligning the housing.

6. The plug connector according to claim 1, wherein the housing is U-shaped, comprising a cover connecting two side walls.

7. The plug connector according to claim 6, wherein the housing is formed as a shield plate comprising a rear wall and an opposing end wall, which extends over the insulating body at a front insulating body part and around the sides.

8. The plug connector according to claim 1, wherein the housing is formed so as to be solderable to the printed circuit board.

9. The plug connector according to claim 1, wherein the housing is metallic and configured, in terms of weight, so that a center of gravity of the housing ensures stable positioning of the entire plug connector prior to soldering.

10. The plug connector according to claim 1, wherein the stop engages the counter-stop at an interior surface inside the through-opening.

11. The plug connector according to claim 1, wherein the larger diameter on the second leg extends from the transition to where the second leg meets the first leg.

12. The plug connector according to claim 1, wherein the larger diameter on the second leg defines a larger length of the second leg than the smaller diameter.

\* \* \* \* \*